(12) United States Patent
Lin et al.

(10) Patent No.: US 7,385,855 B2
(45) Date of Patent: Jun. 10, 2008

(54) NONVOLATILE MEMORY DEVICE HAVING SELF REPROGRAMMING FUNCTION

(75) Inventors: Ching-Yuan Lin, Hsinchu County (TW); Chien-Liang Kuo, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 11/306,370

(22) Filed: Dec. 26, 2005

(65) Prior Publication Data

US 2007/0147127 A1 Jun. 28, 2007

(51) Int. Cl.
*G11C 16/06* (2006.01)

(52) U.S. Cl. .................... 365/185.25; 365/185.21; 365/222

(58) Field of Classification Search ............ 365/185.25
See application file for complete search history.

(56) References Cited

U.S. PATENT DOCUMENTS

| | | | | |
|---|---|---|---|---|
| 5,347,486 A * | 9/1994 | Urai | ............ | 365/185.25 |
| 5,408,432 A * | 4/1995 | Watanabe | ........ | 365/185.21 |
| 5,428,580 A * | 6/1995 | Kawashima et al. | ... | 365/233.5 |
| 5,574,684 A * | 11/1996 | Tomoeda | ............ | 365/185.04 |
| 5,768,193 A * | 6/1998 | Lee et al. | ........ | 365/185.25 |
| 5,852,582 A * | 12/1998 | Cleveland et al. | ... | 365/222 |
| 5,991,196 A * | 11/1999 | Thomsen et al. | ... | 365/185.11 |
| 6,188,610 B1 * | 2/2001 | Kakizoe et al. | ... | 365/185.22 |
| 6,400,601 B1 * | 6/2002 | Sudo et al. | ........ | 365/185.03 |
| 6,421,292 B1 * | 7/2002 | Kitamoto et al. | ... | 365/222 |
| 6,538,924 B2 * | 3/2003 | Dono et al. | ........ | 365/185.08 |
| 6,574,163 B2 * | 6/2003 | Maeda | ............ | 365/233 |
| 6,703,870 B2 * | 3/2004 | Chung et al. | ... | 327/51 |
| 6,963,507 B2 * | 11/2005 | Tanaka et al. | ... | 365/185.28 |
| 7,254,061 B2 * | 8/2007 | Nam et al. | ........ | 365/185.17 |
| 2003/0128055 A1 * | 7/2003 | Lin et al. | ... | 327/57 |
| 2006/0092716 A1 * | 5/2006 | Nam et al. | ........ | 365/189.05 |
| 2006/0126397 A1 * | 6/2006 | Tanishima | ........ | 365/185.29 |

* cited by examiner

*Primary Examiner*—Son L Mai
(74) *Attorney, Agent, or Firm*—Jianq Chyun IP Office

(57) ABSTRACT

A nonvolatile memory device having a self reprogramming function is provided. The nonvolatile memory device includes a memory cell, a first transistor, a second transistor, and a latch circuit. The memory cell is for data storage. The first transistor receives a reading control signal at a gate. And a first source/drain is electrically coupled to the memory cell. The second transistor receives a reset control signal at a gate. A source/drain is electrically coupled to a second source/drain of the first transistor, and a second source/drain of the second transistor is grounded. In addition, the electrical characteristics of the second transistor are opposite to that of the first transistor. The latch circuit includes a latch input terminal and a latch output terminal. In which, the latch input terminal is electrically coupled to the second source/drain of the first transistor and the first source/drain of the second transistor.

10 Claims, 5 Drawing Sheets

NONVOLATILE MEMORY DEVICE HAVING SELF REPROGRAMMING FUNCTION

BACKGROUND OF THE INVENTION

1. Field of the Invention

The present invention relates to a nonvolatile memory, and more particularly, to a nonvolatile memory having a reprogramming function.

2. Description of the Related Art

FIG. 1 schematically shows a flow chart illustrating a conventional method for fabricating a nonvolatile memory. Referring to FIG. 1, a plurality of steps are required for fabricating a nonvolatile memory. First, in step S101, the fabrication process is performed. Then, in step S103, a test process is performed on the nonvolatile memory. When the test result is indicated that the nonvolatile memory is good (i.e. "good" as indicated in step S103), a packaging process is performed in step S11. Otherwise, if it is found that a defect exists in the nonvolatile memory during the fabrication process of S101 (i.e. "fail" as indicated in step S103), an E-fuse technique is performed to repair the nonvolatile memory during step S105. In step S107, the fabrication process is performed. Then in step S109, the testing process is performed on the repaired nonvolatile memory. If the repaired nonvolatile memory is made to be a good product (i.e. "good" as indicated in step S109), the packaging process is performed in step S111. However, if there is still some defects in the repaired nonvolatile memory (i.e. "fail" as indicated in step S103), the nonvolatile memory is scrapped.

Referring to FIG. 1, after the packaging process is completed on the nonvolatile memory, a program code is recorded into the memory in step S113, and a final testing is performed in step S115. Then, in step S117, it is determined whether the memory has passed the final testing of step S115. If the memory has passed the final testing in step S115 (i.e. "yes" as indicated in step S117), a final testing is directly performed on the memory in step S121. Otherwise, if the memory does not pass the final testing in step S115 (i.e. "no" as indicated in step S117), the E-fuse technique is performed to repair the nonvolatile memory in step S119. Then the final testing is performed again on the memory in step S121. Afterwards, in step S123, it is determined whether the memory has passed the final testing in step S121. If the memory does not pass the final testing in step S121 (i.e. "no" as indicated in step S123), the memory is scrapped. Otherwise, if the memory has passed the final test of step S121 (i.e. "yes" as indicated in step S123), the memory is ready for shipment.

In general, the final testing in the steps S115 or S121 mentioned above may include a temperature test, that is to test the operation of the memory under different temperature environments. In such cases, various thermal intensities having different temperatures are applied on the memory. However, the charges inside the memory are easily lost under exposure to elevated temperatures. And the program code could be messed up if the memory is used for an extended period of time under such elevated temperature conditions. Accordingly, a nonvolatile memory having a self-refreshing function is disclosed in U.S. Pat. No. 5,347,486.

The technique disclosed in U.S. Pat. No. 5,347,486 is suitable for larger capacity memory devices. Since its circuit structure is more complicated, it is not as suitable for application in the smaller sized circuit. However, micro circuit is widely used in different applications such as the RFID (radio frequency identification) circuit where the memory device disclosed in U.S. Pat. No. 5,347,486 is not as suitable.

SUMMARY OF THE INVENTION

Therefore, it is an object of the present invention to provide a nonvolatile memory having a self reprogramming function. The nonvolatile memory is able to resolve the problem of data losses in the memory under high temperature testing, and also is suitable for the application in micro circuit.

The present invention provides a nonvolatile memory having a self reprogramming function. The nonvolatile memory includes a memory cell for storing data, a sense amplifier, a writing amplifier, and a latch circuit. The sense amplifier is used for reading the state of the memory cell in response to a reading control signal, and to output the read state to the latch circuit. The writing amplifier is to determine whether to program the memory cell in response to a writing control signal. In addition, the latch circuit has a latch input terminal and a latch output terminal. Furthermore, the latch input terminal is electrically coupled to the sense amplifier and the writing amplifier.

In an embodiment of the present invention, the sense amplifier includes a first PMOS transistor and a first NMOS transistor. In which, a reading control signal is received by a gate of the first PMOS transistor. And a first source/drain and a second source/drain of the first PMOS transistor are electrically coupled to the memory cell and to the latch input terminal of the latch circuit, respectively. In addition, a reset control signal is received by a gate of the first NMOS transistor. A first source/drain of the first NMOS transistor is electrically coupled to the second source/drain of the first PMOS transistor. In addition, a second source/drain of the first NMOS transistor is grounded.

Moreover, the sense amplifier further includes a second NMOS transistor. In which, a loading control signal is received by a gate of the second NMOS transistor, a first source/drain of the second NMOS transistor is electrically coupled to the latch input terminal of the latch circuit, and a writing data is received by a second source/drain of the second NMOS transistor.

Furthermore, the latch circuit includes a first inverter and a second inverter. In which, an input terminal and an output terminal of the first inverter are electrically coupled to the latch input terminal and the latch output terminal of the latch circuit, respectively. An input terminal and an output terminal of the second inverter are electrically coupled to the output terminal and the input terminal of the first inverter, respectively.

In an embodiment of the present invention, the writing amplifier includes a third NMOS transistor and a fourth NMOS transistor. In which, a writing control signal is received by a gate of the third NMOS transistor, a first source/drain of the third NMOS transistor is electrically coupled to the memory cell, and a second source/drain of the third NMOS transistor is electrically coupled to a first source/drain of the fourth NMOS transistor. In addition, a gate of the fourth NMOS transistor is electrically coupled to the latch input terminal of the latch circuit. In addition, the first source/drain and a second source/drain of the fourth NMOS transistor are electrically coupled to the second source/drain of the third NMOS transistor and are grounded, respectively.

When the testing process is performed on the nonvolatile memory provided by the present invention under the elevated temperature conditions, the state of the memory cell is latched in the latch circuit by enabling the reading control signal. After the testing process performed on the memory is completed, the writing amplifier determines whether to program the memory cell according to the state latched in the latch circuit. Accordingly, the present invention is able to avoid the data loss under the high temperature testing conditions. Moreover, since each memory cell in the present invention is disposed with a latch circuit, the present invention is able to provide the self-reprogramming function without using complicated circuit structure. As a result, the present invention is suitable for application in the smaller sized circuit.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

Figure 1:
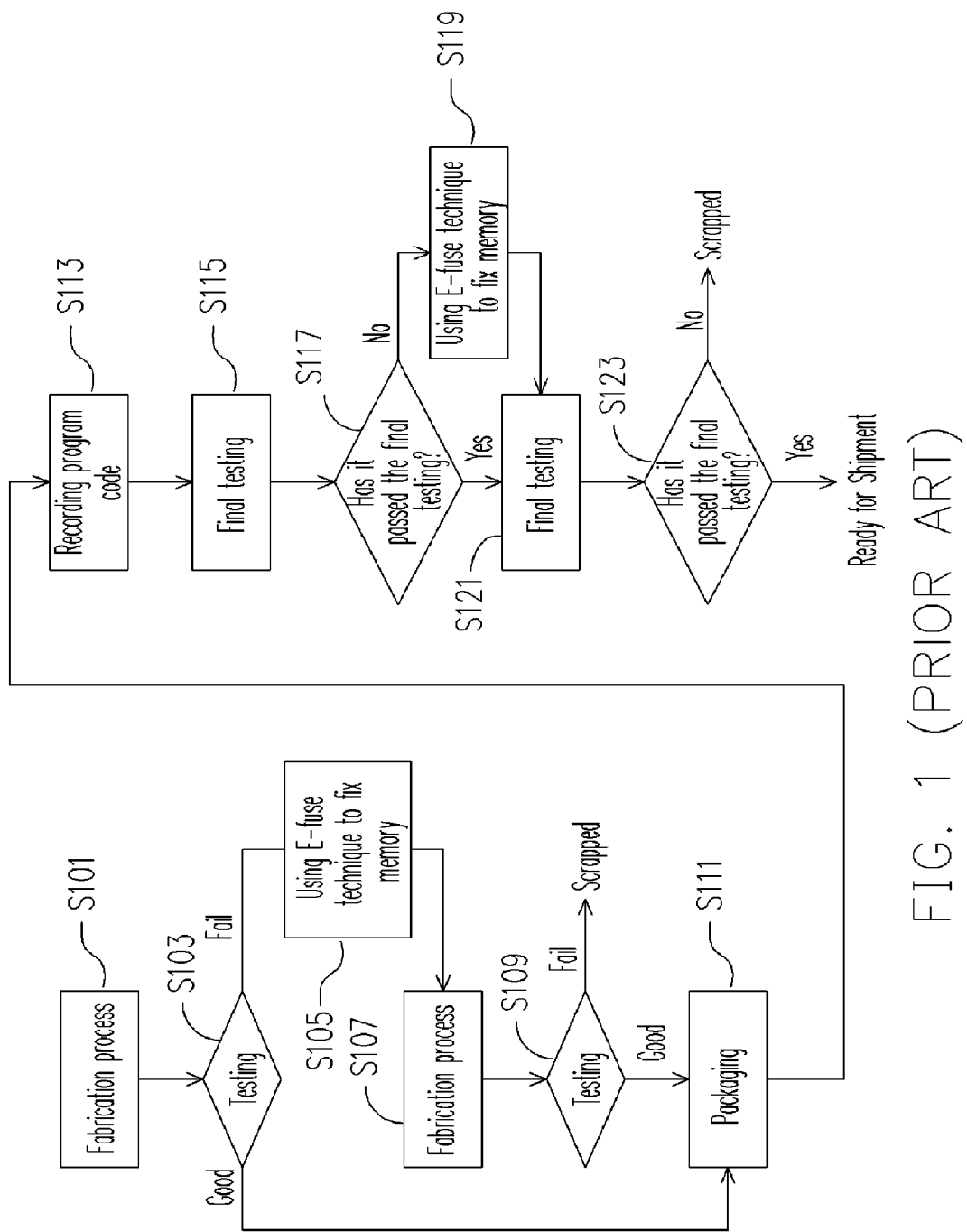
FIG. 1 schematically shows a flow chart illustrating a conventional method for the fabrication of a nonvolatile memory.

Reference shall now be made in detail to the present embodiments of the invention, in which examples are illustrated in the accompanying drawings. Wherever possible, the same reference numbers are used in the drawings and in the description to refer to the same or like parts. In addition, the types of the transistor described hereinafter such as the NMOS transistor, the PMOS transistor, and the PMOS memory device are all embodiments of the present invention. However, other types of transistors or memory devices can also be used by one of ordinary skills in the art according to the actual physical requirements without departing from the main spirit of the invention.

Figure 2:
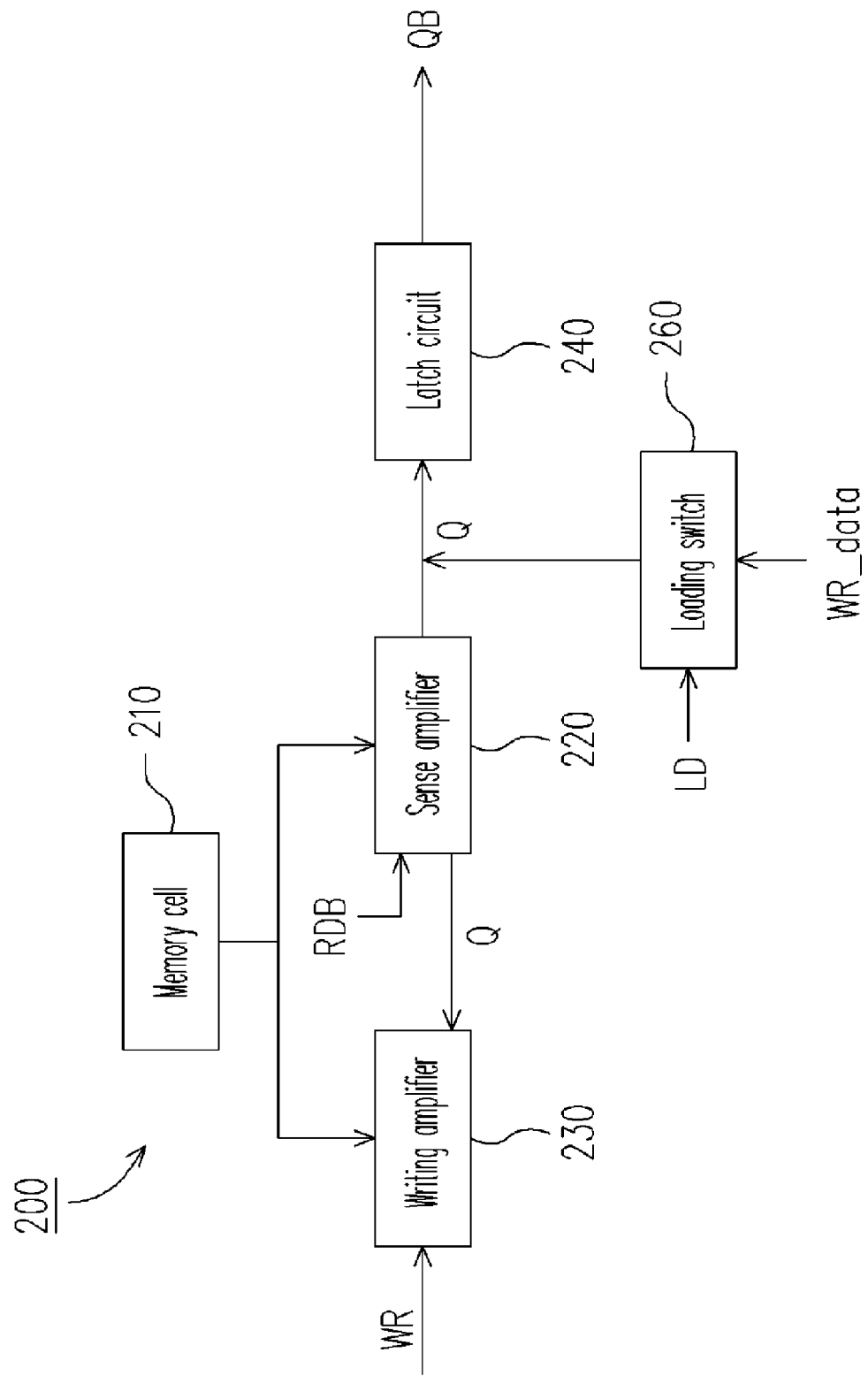
FIG. 2 is a block diagram of a configuration of a non-volatile memory having a self-reprogramming function, according to an embodiment of the present invention.

FIG. 2 is a block diagram of a configuration of a non-volatile memory having a self-reprogramming function, according to an embodiment of the present invention. Referring to FIG. 2, the memory circuit 200 provided by the present invention at least includes a memory cell 210. In addition, the memory cell 210 is electrically coupled to a sense amplifier 220 and a writing amplifier 230. The sense amplifier 220 is electrically coupled to the latch circuit 240 via a latch input terminal Q, and the latch circuit 240 is electrically coupled to the writing amplifier 230 via the latch input terminal Q.

In other embodiments of the present invention, the sense amplifier 200 further includes a loading switch 260. In which, a writing data WR_data is transmitted by the loading switch 260 to the latch input terminal of the latch circuit 240 in response to a loading control signal LD.

Figure 3:
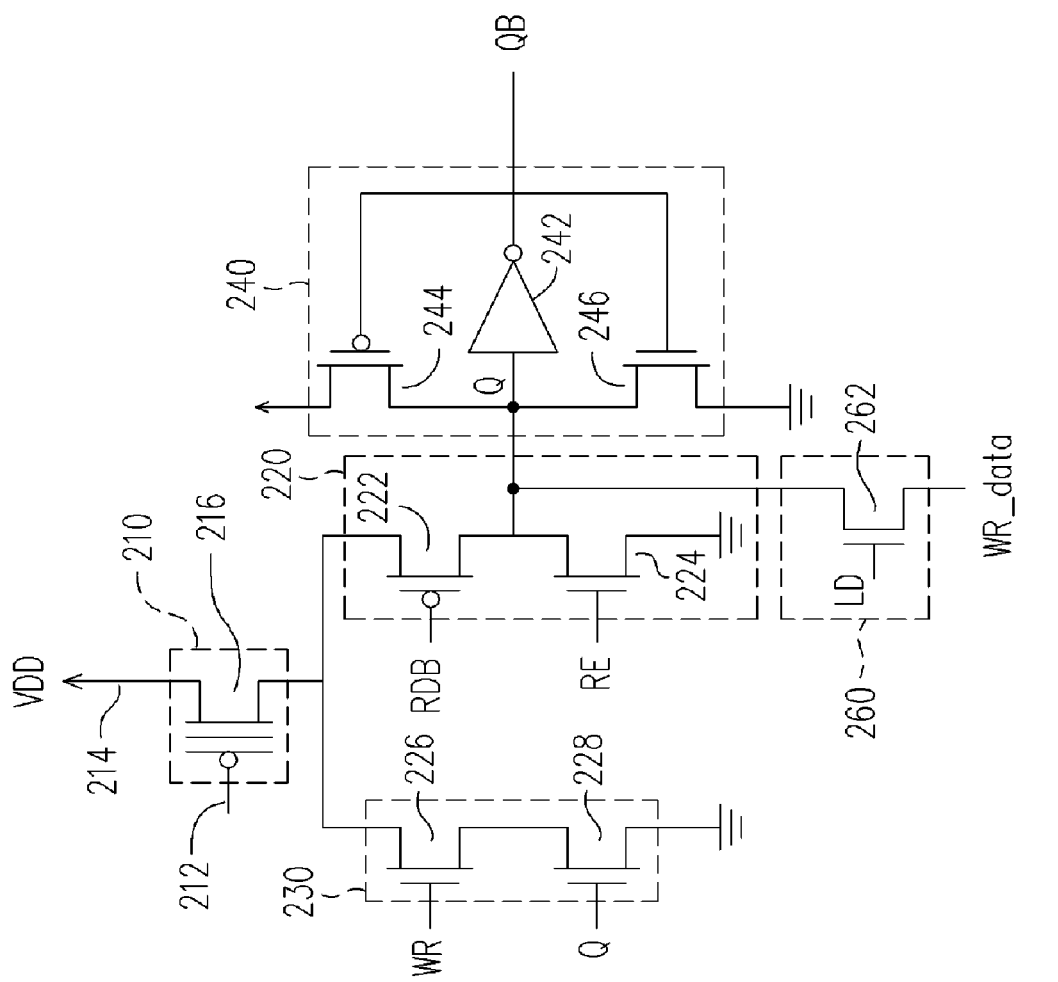
FIG. 3 is a circuit diagram of a nonvolatile memory having a self-reprogramming function, according to an embodiment of the present invention.

FIG. 3 is a circuit diagram of a nonvolatile memory having a self-reprogramming function according to an embodiment of the present invention. Referring to FIG. 3, the memory cell 210 further includes a PMOS memory device 216. In which, a first gate of the PMOS memory device 216 is electrically coupled to a word line 212, a first source/drain of the PMOS memory device 216 is electrically coupled to a bit line 214 and a DC bias VDD, and a second source/drain of the PMOS memory device 216 is electrically coupled to the sense amplifier 220. In addition, the threshold voltage of the PMOS memory device 216 is determined by applying the high voltage/current to write into the electric charge.

In the present embodiment, the sense amplifier 220 mainly includes a PMOS transistor 222 and an NMOS transistor 224. In which, a first source/drain of the PMOS transistor 222 is electrically coupled to the memory cell 210, a reading control signal RDB is received by a gate of the PMOS transistor 222, and a second source/drain of the PMOS transistor 222 is electrically coupled to the NMOS transistor 224 and the latch input terminal Q of the latch circuit 240. A reset control signal RE is received by a gate of the NMOS transistor 224, a first source/drain of the NMOS transistor 224 is electrically coupled to the second source/drain of the PMOS transistor 222, and a second source/drain of the NMOS transistor 224 is grounded.

Referring to FIG. 3, the writing amplifier 230 further includes the NMOS transistors 226 and 228. In which, a writing control signal WR is received by a gate of the NMOS transistor 226, and a first source/drain and a second source/drain of the NMOS transistor 226 are electrically coupled to the first source/drain of the PMOS transistor 222 and to a first source/drain of the NMOS transistor 228, respectively. In addition, the first source/drain and a gate of the NMOS transistor 228 are electrically coupled to the second source/drain of the NMOS transistor 226 and to the latch input terminal Q of the latch circuit 240, respectively. And a second source/drain of the NMOS transistor 228 is grounded.

Moreover, in the present embodiment, the latch circuit 240 may be embodied by using two inverters. The output terminals of the two inverters are electrically coupled to their respective input terminals. In the present embodiment, the latch circuit 240 includes an inverter 242. In which, an input terminal and an output terminal of the inverter 242 are electrically coupled to the latch input terminal Q and to a latch output terminal QB of the latch circuit 240, respectively.

Furthermore, the latch circuit 240 further includes a PMOS transistor 244 and an NMOS transistor 246. In which, a first source/drain of the PMOS transistor 244 is electrically coupled to a DC bias, a gate of the PMOS transistor 244 is electrically coupled to the output terminal of the inverter 242, and a second source/drain of the PMOS transistor 244 is electrically coupled to a first source/drain of the NMOS transistor 246. In addition, a gate of the NMOS transistor 246 is electrically coupled to the output terminal of the inverter 242. And a second source/drain of the NMOS transistor 246 is grounded.

In the present embodiment, the loading switch 260 includes an NMOS transistor 262. In which, a first source/drain of the NMOS transistor 262 is electrically coupled to the latch input terminal Q, a loading control signal LD is received by a gate of the NMOS transistor 262, and the writing data WR_data is received by a second source/drain of the NMOS transistor 262.

Figure 4:
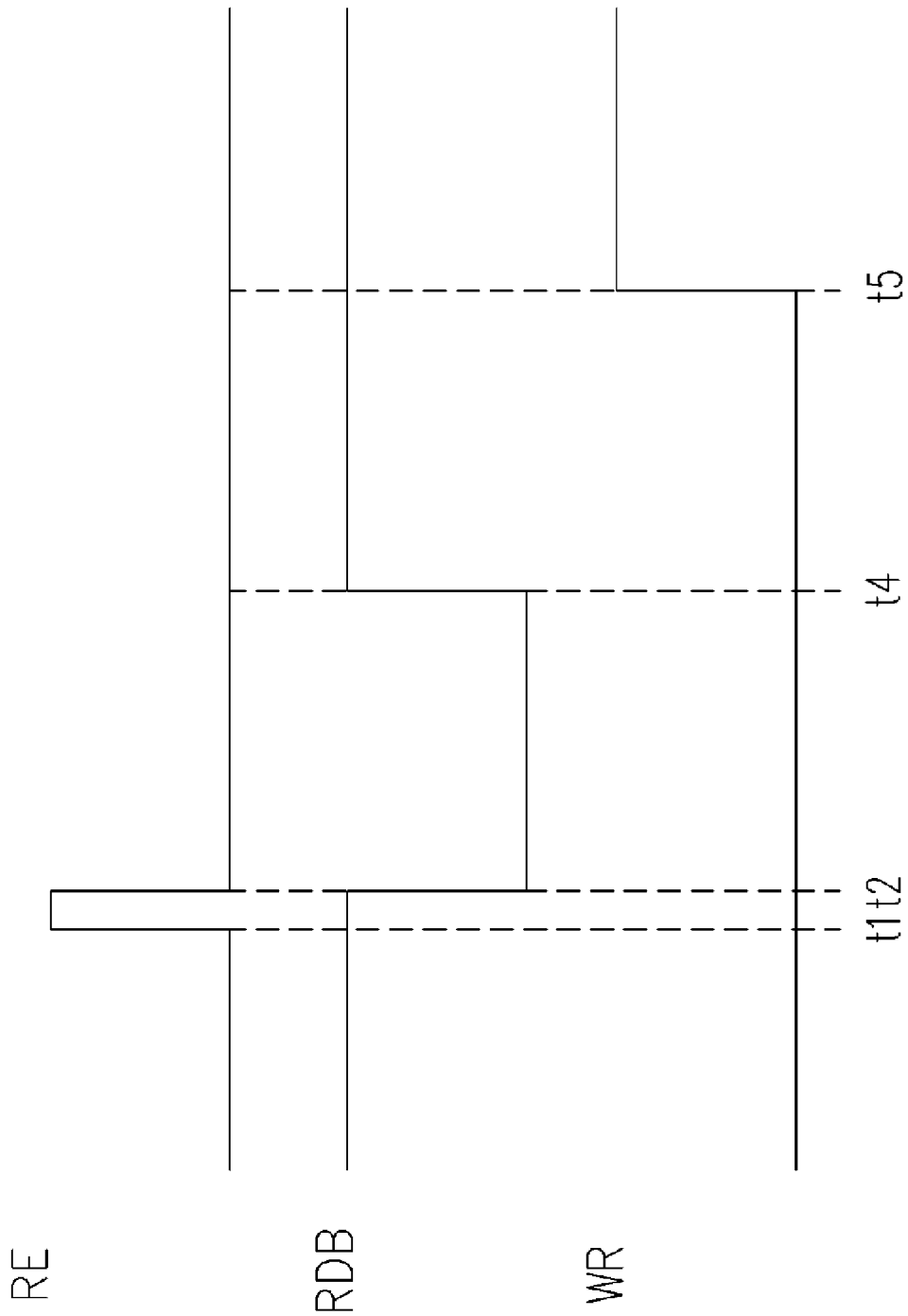
FIG. 4 is a timing diagram of a plurality of control signals in FIG. 2, according to an embodiment of the present invention.

FIG. 4 is a timing diagram of the control signals in FIG. 2, according to an embodiment of the present invention. Referring to FIGS. 2, 3, and 4, it is assumed that when a final testing, such as the high temperature test, is performed on the memory 200 of the present invention, a pulse of the reset control signal RE is generated at the time point t1, which turns on the NMOS transistor 224. Meanwhile, the latch input terminal Q of the latch circuit 240 is pulled down to a ground level.

Then, at the time point t2, the reset control signal RE is disabled. Furthermore, the reading control signal RDB is transited from the high potential to the low potential, which turns off the NMOS transistor 224 and turns on the PMOS transistor 222. As a result, the state of the memory cell 210 is latched on the latch input terminal Q of the latch circuit 240.

Then, at the time point t4, the reset control signal RDB is transited from the low potential to the high potential, which turns off the PMOS transistor 222 again. Meanwhile, the data stored in the memory cell 210 had been latched on the output terminal QB of the latch circuit 240.

In addition, since the gate of the NMOS transistor 228 is electrically coupled to the latch input terminal Q of the latch circuit 240, the NMOS transistor 228 is turned on when the latch input terminal Q is on the high potential, and the NMOS transistor 228 is turned off when the latch input terminal Q is on the low potential.

It is assumed that the memory 200 has passed the final testing before the time point t5, thus the writing control signal WR is enabled at the time point t5. Meanwhile, the NMOS transistor 226 is turned on. Here, whether the NMOS transistor 228 is turned on or off is determined by the voltage level on the latch input terminal Q. Assuming that the state of the memory cell 210 previously latched on the latch input terminal Q is on a programming state, which indicates the voltage level on the latch input terminal Q to be on a high level state, meanwhile, the NMOS transistor 228 is turned on and a programming current is generated to program the PMOS memory device 216.

On the other hand, when the state of the memory cell 210 previously latched on the latch input terminal Q is in an erase state, which indicates the voltage level on the latch input terminal Q to be on a low level state, meanwhile, the NMOS transistor 228 is turned off and the programming current is not generated. In the aforementioned case, the memory cell 210 is maintained in the erase state.

Figure 5:
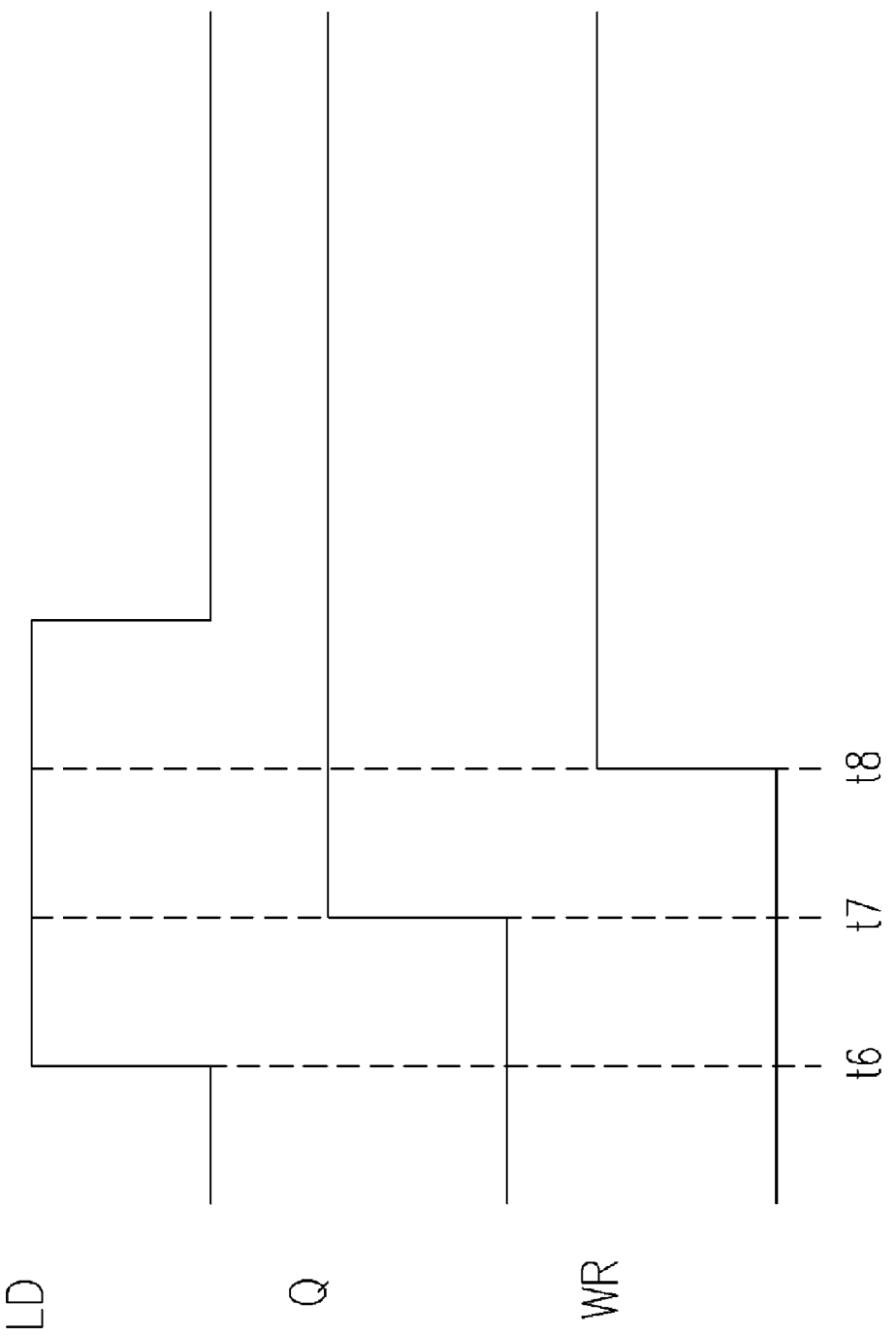
FIG. 5 is a timing diagram of the signals for programming the memory cell.

FIG. 5 is a timing diagram of the signals for programming the memory cell. Referring to FIGS. 3 and 5, the loading control signal LD is enabled first at the time point t6 when it is desired to program the memory cell 210, which turns on the NMOS transistor 262.

Then, at the time point t7, the data is transmitted to the latch input terminal Q of the latch circuit 240 via the NMOS transistor 262, such that the voltage level on the latch input terminal Q is pulled up to the high level state. Meanwhile, since the voltage level on the latch input terminal Q is at the high level state, the NMOS transistor 228 is turned on. Then at the time point t8, the writing control signal WR is enabled, which turns on the NMOS transistor 226. In case the NMOS transistors 226 and 228 are both turned on, a programming current is generated by the writing amplifier 230 to program the memory cell 210.

In summary, the present invention has at least the following advantages:

1. since the data stored in the memory cell in the latch circuit before the temperature test is able to be temporarily latched, the present invention is able to avoid the data losses during the high temperature test; and 2. since each memory cell is disposed with a latch circuit, the present invention is suitable for the smaller sized memory devices and for disposing in micro circuit.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A nonvolatile memory having a self-reprogramming function, comprising:
   a memory cell for storing a data;
   a sense amplifier for reading a state of the memory cell in response to a reading control signal;
   a latch circuit having a latch input terminal and a latch output terminal, wherein the latch input terminal receives an output from the sense amplifier for latching the state of the memory cell; and
   a writing amplifier, comprising
      a first NMOS transistor, having a gate for receiving writing control signal, a first source/drain electrically coupled to the memory cell; and
      a second NMOS transistor having a gate electrically coupled to the latch input terminal for coupling to the latched state of the memory cell, and the first source/drain and a second source/drain electrically coupled to a second source/drain of the first NMOS transistor and grounded, respectively,
   for determining whether to program the memory cell in response to a writing control signal and the latched state of the memory cell.

2. The nonvolatile memory having the self-reprogramming function of claim 1, wherein the sense amplifier comprises:
   a first PMOS transistor, having a gate receiving the reading control signal, a first source/drain electrically coupled to the memory cell, and a second source/drain electrically coupled to the latch input terminal; and
   a third NMOS transistor, having a gate receiving a reset control signal, a first source/drain electrically coupled to the second source/drain of the first PMOS transistor, and a second source/drain of the third NMOS transistor grounded, respectively.

3. The nonvolatile memory having the self-reprogramming function of claim 1, further comprising a loading switch for transmitting a writing data into the latch input terminal in response to a loading control signal.

4. The nonvolatile memory having the self-reprogramming function of claim 3, wherein the loading switch comprises a fourth NMOS transistor having a gate receiving the loading control signal, and a first source/drain electrically coupled to the latch input terminal.

5. The nonvolatile memory having the self-reprogramming function of claim 1, wherein the latch circuit further comprises:
   a second PMOS transistor, having a first source/drain electrically coupled to a DC bias, and a second source/drain and a gate electrically coupled to the latch input terminal and the latch output terminal of the latch circuit, respectively; and
   a fifth NMOS transistor, having a first source/drain and a gate electrically coupled to the latch input terminal and the latch output terminal of the latch circuit, respectively, and a second source/drain of the fifth NMOS transistor grounded.

6. The nonvolatile memory having the self-reprogramming function of claim 2, wherein the memory cell comprises a PMOS memory device having a gate electrically coupled to a word line, a first source/drain electrically coupled to a DC bias, and a second source/drain electrically coupled to the first source/drain of the first PMOS transistor.

7. The nonvolatile memory having the self-reprogramming function of claim 6, wherein the PMOS memory device is a device able to change the threshold voltage by applying a high voltage/current to write the electric charge into the cell.

8. A nonvolatile memory having a self-reprogramming function, comprising:
   a first first-conductive-type MOS transistor, having a gate receiving a reading control signal, a first source/drain, and a second source/drain electically coupled to a latch input terminal;
   a first second-conductive-type MOS transistor, having a gate receiving a reset control signal, a first source/drain electrically coupled to the second source/drain of the first first-conductive-type MOS transistor, and a second source/drain of the first second-conductive-type MOS transistor grounded, respectively;
   a second-conductive-type MOS transistor, having a gate receiving the loading control signal, and a first source/drain electrically coupled to the latch input terminal;
   a first inverter, having an input terminal and an output terminal electrically coupled to a latch input terminal and a latch output terminal, respectively;
   a second first-conductive-type MOS transistor, having a first source/drain electrically coupled to a DC bias, and a second source/drain and a gate electrically coupled to the latch input terminal and the latch output terminal of the latch circuit, respectively;
   a third second-conductive-type MOS transistor, having a first source/drain and a gate electrically coupled to the latch input terminal and the latch output terminal, respectively, and a second source/drain of the third second-conductive-type MOS transistor grounded,
   a fourth second-conductive-type MOS transistor, having a gate receiving a writing control signal, a first source/drain electrically coupled to the first source/drain of the first first-conductive-type MOS transistor;
   a fifth second-conductive-type MOS transistor, having a gate electrically coupled to the latch input terminal, and a first source/drain electrically coupled to a second source/drain of the fourth NMOS transistor and a second source/drain electrically coupled to the second source/drain of the fourth second-conductive-type MOS transistor and grounded, respectively, and
   a third first-conductive-type MOS transistor, having a gate electrically coupled to a word line, a first source/drain electrically coupled to another DC bias, and a second source/drain electrically coupled to the first source/drain of the first first-conductive-type MOS transistor.

9. The nonvolatile memory having the self-reprogramming function of claim 8, wherein the first-conductive-type MOS transistor is a PMOS transistor.

10. The nonvolatile memory having the self-reprogramming function of claim 8, wherein the second-conductive-type MOS transistor is a NMOS transistor.

* * * * *